United States Patent
Mao et al.

(10) Patent No.: US 12,191,408 B2
(45) Date of Patent: Jan. 7, 2025

(54) SOLAR CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Jie Mao, Zhejiang (CN); Zhao Wang, Zhejiang (CN); Peiting Zheng, Zhejiang (CN); Jie Yang, Zhejiang (CN); Xinyu Zhang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/051,878

(22) Filed: Nov. 2, 2022

(65) Prior Publication Data
US 2024/0088308 A1 Mar. 14, 2024

(30) Foreign Application Priority Data
Sep. 8, 2022 (CN) .......................... 202211098333.3

(51) Int. Cl.
*H01L 31/0224* (2006.01)
*H01L 31/02* (2006.01)
(Continued)

(52) U.S. Cl.
CPC ............... *H01L 31/022441* (2013.01); *H01L 31/02008* (2013.01); *H01L 31/035209* (2013.01); *H01L 31/0481* (2013.01); *H01L 31/1868* (2013.01)

(58) Field of Classification Search
CPC ......... H01L 31/02167; H01L 31/02168; H01L 31/068; H01L 31/0682; H01L 31/022441;
(Continued)

(56) References Cited

U.S. PATENT DOCUMENTS 11,581,454 B1  2/2023  Yu et al.
2010/0065117 A1  3/2010  Kim et al.
(Continued)

FOREIGN PATENT DOCUMENTS

CN  104409571 A  3/2015
CN  205194713 U  4/2016
(Continued)

OTHER PUBLICATIONS

Zhejiang Jinko Solar Co., Ltd., et al., Extended European Search Report, EP22204989.2, Aug. 24, 2023, 7pgs.
(Continued)

*Primary Examiner* — Mayla Gonzalez Ramos
(74) *Attorney, Agent, or Firm* — USCH Law, PC

(57) ABSTRACT

Embodiments of the present disclosure relates to the field of solar cells, and in particular to a solar cell and a photovoltaic module. The solar cell includes: a substrate having a front surface and a rear surface; a first tunnel layer and a first doped conductive layer sequentially formed over the front surface of the substrate, the first tunnel layer and the first doped conductive layer are each aligned with a metal pattern region on the front surface; and a second tunnel layer and a second doped conductive layer sequentially formed over the rear surface of the substrate, and in a respective Raman spectrum, a full width at half maximum corresponding to the first doped conductive layer is not greater than a full width at half maximum corresponding to the second doped conductive layer.

20 Claims, 3 Drawing Sheets

(51) Int. Cl.
*H01L 31/0352* (2006.01)
*H01L 31/048* (2014.01)
*H01L 31/18* (2006.01)

(58) Field of Classification Search
CPC ....... H01L 31/02008; H01L 31/035209; H01L 31/0481; H01L 31/1868
See application file for complete search history.

(56) References Cited

U.S. PATENT DOCUMENTS

| | | | |
|---|---|---|---|
| 2012/0090673 | A1 | 4/2012 | Dimitrov et al. |
| 2013/0048073 | A1 | 2/2013 | Karakida |
| 2015/0280048 | A1* | 10/2015 | Jeong .................... H01L 31/068 438/97 |
| 2016/0276515 | A1* | 9/2016 | Chang .................... H01L 31/074 |
| 2017/0179325 | A1* | 6/2017 | Chung ................ H01L 31/0682 |
| 2019/0157497 | A1 | 5/2019 | Yoon et al. |
| 2020/0135944 | A1 | 4/2020 | Yi et al. |
| 2020/0287066 | A1* | 9/2020 | Stodolny ............... H01L 31/048 |
| 2020/0350445 | A1 | 11/2020 | Cheong et al. |
| 2021/0399150 | A1 | 12/2021 | Hilali et al. |
| 2022/0102568 | A1* | 3/2022 | Yang .................... H01L 31/0745 |
| 2022/0209031 | A1 | 6/2022 | Breus et al. |

FOREIGN PATENT DOCUMENTS

| | | | | |
|---|---|---|---|---|
| CN | 105826411 | A | 8/2016 | |
| CN | 110610998 | A | 12/2019 | |
| CN | 111146311 | A | 5/2020 | |
| CN | 112201701 | A * | 1/2021 | ....... H01L 31/02167 |
| CN | 112885924 | A | 6/2021 | |
| CN | 113078232 | A | 7/2021 | |
| CN | 214043687 | U | 8/2021 | |
| CN | 113964241 | A | 1/2022 | |
| CN | 114497241 | A | 5/2022 | |
| CN | 114512551 | A | 5/2022 | |
| CN | 114613865 | A | 6/2022 | |
| CN | 114613867 | A | 6/2022 | |
| CN | 114784148 | A | 7/2022 | |
| CN | 114823951 | A | 7/2022 | |
| CN | 216871997 | U | 7/2022 | |
| CN | 217306521 | U | 8/2022 | |
| DE | 102021000501 | A1 | 8/2022 | |
| EP | 2704214 | B1 | 10/2018 | |
| EP | 3979336 | A1 | 4/2022 | |
| JP | 2012129533 | A | 7/2012 | |
| JP | 2012164712 | A | 8/2012 | |
| JP | 2014082285 | A | 5/2014 | |
| JP | 2014192370 | A | 10/2014 | |
| JP | 2014238969 | A | 12/2014 | |
| JP | 2015531550 | A | 11/2015 | |
| JP | 2017112379 | A | 6/2017 | |
| JP | 2017126748 | A | 7/2017 | |
| JP | 2017130664 | A | 7/2017 | |
| JP | 2018082157 | A | 5/2018 | |
| JP | 2018085509 | A | 5/2018 | |
| JP | 2019068108 | A | 4/2019 | |
| JP | 2022058069 | A | 4/2022 | |
| JP | 2022081366 | A | 5/2022 | |
| KR | 20140003669 | A | 1/2014 | |
| KR | 101740523 | B1 | 5/2017 | |
| KR | 1020170073480 | A | 6/2017 | |
| KR | 20210067386 | A | 6/2021 | |
| WO | 2013161373 | A1 | 10/2013 | |
| WO | 2014162979 | A1 | 10/2014 | |
| WO | 2016163168 | A1 | 10/2016 | |
| WO | 2017002927 | A1 | 1/2017 | |

OTHER PUBLICATIONS

Zhejiang Jinko Solar Co., Ltd., et al., Notice-of-Allowance, U.S. Appl. No. 17/960,711, Jul. 6, 2023, 11 pgs.
Zhejiang Jinko Solar Co., Ltd., et al., Extended European Search Report, EP22199678.8, Aug. 18, 2023, 6pgs.
Zhejiang Jinko Solar Co., Ltd., et al., Notice-of-Allowance, U.S. Appl. No. 17/960,687, Jun. 1, 2023, 9 pgs.
Zhejiang Jinko Solar Co., Ltd., et al., Extended European Search Report, EP 22199634.1, Jul. 5, 2023, 7 pgs.
Peibst Robby, et al., "For None, One, or Two Polarities—How Do Polo Junctions Fit Best Into Industrial Si Solar Cells?", Progress in Photovoltaics: Research and Applications, vol. 28, No. 6, Hoboken, USA, ISSN:1062-7995, DOI:10.1002/PIP.3201, Jun. 1, 2020, 14 pgs.
Haase F, et al., "Cells and Modules With Passivating Contacts—Polo Technology", May 9, 2019, 13 pgs. Retrieved From the Internet: URL:https://16iwy1195vvfgoqu3136p21y-wpengine.netdna-ssl.com/wp-content/uploads/2019/04/20190509_Webinar-PERC-and-beyond_Haase.pdf.
Charles Seron, et al., "Hydrogenation of Sputtered ZnO: Al Layers for Double Side Poly-Si/Siox Integration", 38th European Photovoltaic Solar Energy Conference and Exhibition, Sep. 10, 2021, 4 pgs.
E. Saugar, et al., "Laser-Induced Crystallization of Sputtered Unhydrogenated Silicon at Low Temperatures", 33rd European Photovoltaic Solar Energy Conference and Exhibition: Proceedings of the International Conference, Sep. 2017, 5 pgs.
Zheng Jingming, et al., "Blistering-free polycrystalline silicon carbide films for double-sided passivating contact solar cells", Solar Energy Materials and Solar Cells, vol. 238, May 2022, 10 pgs.
Ghosh Dibyendu Kumar, et al., "Fundamentals, present status and future perspective of TOPCon solar cells: A comprehensive review", Surfaces and Interfaces, vol. 30, Jun. 2022, 38 pgs.
Zhejiang Jinko Solar Co., Ltd., et al., Examination report No. 1 for your standard patent application, AU 2022263498, Oct. 19, 2023, 9 pgs.
Zhejiang Jinko Solar Co., Ltd., et al., Notice of acceptance for your patent application, AU 2022246372, Sep. 11, 2023, 4 pgs.
Zhejiang Jinko Solar Co., Ltd., et al., Notice of Reason for Refusal, JP 2023-215735, Mar. 1, 2024, 10 pgs.
Zhejiang Jinko Solar Co., Ltd., et al., JP Notice of Reasons for Refusal with English translation, JP 2023-215735, Jul. 1, 2024, 13 pgs.
Zhejiang Jinko Solar Co., Ltd., et al., KR First Office Action with English translation , KR 10-2023-0097826, Jun. 18, 2024, 17 pgs.
Zhejiang Jinko Solar Co., Ltd., et al., Examination report No. 1 for standard patent application, AU 2023258334, Sep. 9, 2024, 3 pgs.

* cited by examiner

SOLAR CELL AND PHOTOVOLTAIC MODULE

CROSS REFERENCE TO RELATED APPLICATIONS

The present application claims the benefit of priority under the Paris Convention to Chinese Patent Application No. 202211098333.3 filed on Sep. 8, 2022, which is incorporated herein by reference in its entirety.

TECHNICAL FIELD

Embodiments of the present disclosure relate to the field of solar cells, and in particular to a solar cell and a photovoltaic module.

BACKGROUND

Solar cells have good photoelectric conversion capabilities. Generally, for the purpose of suppressing recombination of carriers at a surface of the substrate of a solar cell and enhancing the passivation effect on the substrate, a tunnel oxide layer and a doped conductive layer are formed over the surface of the substrate, and the doped conductive layer includes a doping element.

The doped conductive layer is used for field passivation, and the doping element in the doped conductive layer can be used for band bending at the surface of the substrate, which plays an important role in the passivation effect of the doped conductive layer, thereby affecting the photoelectric conversion performance of the solar cell. The existing solar cells have the problem of low photoelectric conversion efficiency.

SUMMARY

Embodiments of the present disclosure provide a solar cell and a photovoltaic module, which is at least conducive to the improvement of photoelectric conversion efficiency of a solar cell.

Some embodiments of the present disclosure provide a solar cell, including: a substrate having a front surface and a rear surface opposite to each other; a first tunnel layer and a first doped conductive layer sequentially formed over the front surface of the substrate in a first direction away from the substrate, the first tunnel layer and the first doped conductive layer are each aligned with a metal pattern region on the front surface, and the first doped conductive layer includes a first doping element of a same type as that of a doping element in the substrate; and a second tunnel layer and a second doped conductive layer sequentially formed over the rear surface of the substrate in a second direction opposite to the first direction, the second doped conductive layer includes a second doping element of a different type from that of the first doping element in the first doped conductive layer, and a full width at half maximum near a first peak of a Raman spectrum for the first doped conductive layer is not greater than a full width at half maximum near a first peak of a Raman spectrum for the second doped conductive layer.

In an example, the first peak for the first doped conductive layer is at 520 $cm^{-1}$, and full width at half maximum near 520 $cm^{-1}$ corresponding to the first doped conductive layer ranges from 2 $cm^{-1}$ to 6 $cm^{-1}$.

In an example, the first peak for the second doped conductive layer is at 520 $cm^{-1}$, and full width at half maximum near 520 $cm^{-1}$ corresponding to the second doped conductive layer ranges from 2 $cm^{-1}$ to 8 $cm^{-1}$.

In an example, a thickness of the first doped conductive layer is not greater than a thickness of the second doped conductive layer.

In an example, the thickness of the first doped conductive layer ranges from 20 nm to 300 nm.

In an example, the second doped conductive layer includes an activated second doping element obtained by performing annealing on the second doping element to activate a part of the second doping element, and a concentration of the activated second doping element ranges from $4 \times 10^{19}$ atoms/$cm^3$ to $9 \times 10^{19}$ atoms/$cm^3$.

In an example, the thickness of the second doped conductive layer ranges from 50 nm to 500 nm.

In an example, the first doped conductive layer includes an activated first doping element obtained by performing annealing on the first doping element to activate a part of the first doping element, and a concentration of the activated first doping element ranges from $1 \times 10^{20}$ atoms/$cm^3$ to $6 \times 10^{20}$ atoms/$cm^3$.

In an example, a crystallite size of the first doped conductive layer is greater than a crystallite size of the second doped conductive layer.

In an example, the substrate is an N-type substrate, the first doped conductive layer is an N-type doped conductive layer, and the second doped conductive layer is a P-type doped conductive layer.

In an example, the first doping element includes phosphorus element, and the second doping element includes boron element.

In an example, materials of the first doped conductive layer and of the second doped conductive layer include at least one of silicon carbide, microcrystalline silicon or polycrystalline silicon.

In an example, the solar cell further includes a first passivation layer, a first portion of the first passivation layer is formed on a surface of the first doped conductive layer facing away from the substrate, and a second portion of the first passivation layer is formed on the front surface and is aligned with a non-metal pattern region on the front surface.

In an example, a top surface of the first portion of the first passivation layer is not flush with a top surface of the second portion of the first passivation layer.

In an example, a material of the first passivation layer includes at least one of silicon oxide, aluminum oxide, silicon nitride or silicon oxynitride.

In an example, the solar cell further includes a first electrode formed over the metal pattern region and being electrically connected with the first doped conductive layer.

In an example, the solar cell further includes a diffusion region formed in the substrate and being aligned with the metal pattern region, a top of the diffusion region is in contact with the first tunnel layer, and a concentration of a doping element in the diffusion region is greater than a concentration of the doping element in the substrate.

In an example, the solar cell further includes a second passivation layer formed on a surface of the second doped conductive layer facing away from the substrate.

In an example, the solar cell further includes a second electrode formed on the rear surface of the substrate and being electrically connected with the second doped conductive layer.

Some embodiments of the present disclosure provide a photovoltaic module, including: at least one cell string formed by connecting a plurality of solar cells as described in any one of the above embodiments; at least one encapsulation layer configured to cover a surface of the at least one cell string; and at least one cover plate configured to cover a surface of the at least one encapsulation layer facing away from the at least one cell string.

BRIEF DESCRIPTION OF THE DRAWINGS

One or more embodiments are exemplarily illustrated in reference to corresponding accompanying drawing(s), and these exemplary illustrations do not constitute limitations on the embodiments. Unless otherwise stated, the accompanying drawings do not constitute scale limitations.

DETAILED DESCRIPTION OF THE EMBODIMENTS

It can be known from the background art that the existing solar cells have a poor photoelectric conversion efficiency.

By analysis, it is found that reasons for the poor photoelectric conversion efficiency of the existing solar cells lie in:

on the one hand, at present, a diffusion process is usually performed on a front surface of the substrate to convert a part of the substrate into an emitter including doping ions of a different type from that of ions in the substrate, thereby forming a PN junction together with the non-diffused part of the substrate. However, such structure may lead to excessive recombination of carriers in the metal pattern region on the front surface of the substrate, thereby affecting the open-circuit voltage and conversion efficiency of the solar cell;

on the other hand, the front surface and the rear surface of the solar cell usually have different receptivity of incident light. Therefore, tailored designs for the doped conductive layer formed on the front surface of the solar cell and for the doped conductive layer formed on the rear surface of the solar cell are needed, thereby improving the overall performance of photoelectric conversion of solar cells.

Embodiments of the present disclosure provide a solar cell, including a first doped conductive layer formed on the front surface and a second doped conductive layer formed on the rear surface, and a full width at half maximum corresponding to the first doped conductive layer is not greater than a full width at half maximum corresponding to the second doped conductive layer, such that a crystallite size of the first doped conductive layer is not less than a crystallite size of the second doped conductive layer. The larger the crystallite size of a doped conductive layer, the weaker the absorption ability of incident light of the doped conductive layer. Therefore, a relatively less crystallite size of the first doped conductive layer can lead to a relatively less parasitic absorption of incident light on the front surface by the first doped conductive layer, thereby improving absorption and utilization rate of incident light by the doped substrate. In this way, the photoelectric conversion performance of the solar cell can be improved.

Embodiments of the present disclosure will be described in detail below with reference to the accompanying drawings. Those skilled in the art should understand that, in the embodiments of the present disclosure, many technical details are provided for the reader to better understand the present disclosure. However, even without these technical details and various modifications and variants based on the following embodiments, the technical solutions claimed in the present disclosure can be realized.

Figure 1:
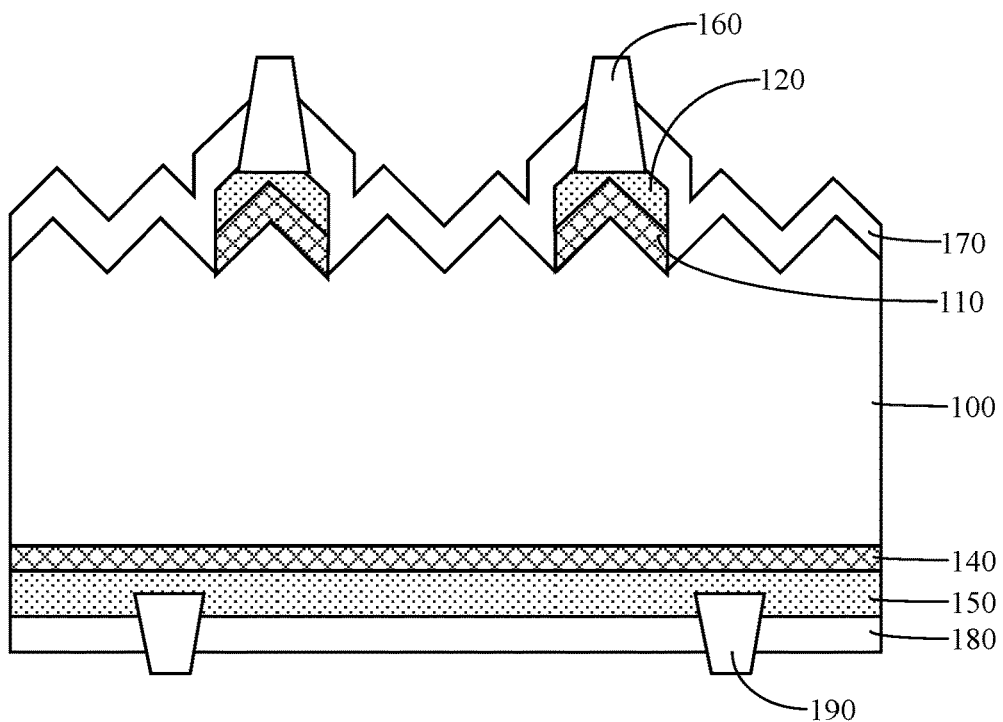
FIG. 1 is a structural schematic diagram of a section of a solar cell according to some embodiments of the present disclosure.

FIG. 1 is a structural schematic diagram of a section of a solar cell according to some embodiments of the present disclosure.

Referring to FIG. 1, the solar cell includes:

a substrate 100 having a front surface and a rear surface opposite to each other;

a first tunnel layer 110 and a first doped conductive layer 120 sequentially formed over the front surface of the substrate 100 in a first direction away from the substrate 100, the first tunnel layer 110 and the first doped conductive layer 120 are each aligned with a metal pattern region on the front surface, and the first doped conductive layer 120 includes a first doping element of a same type as that of a doping element in the substrate 100; and a second tunnel layer 140 and a second doped conductive layer 150 sequentially formed over the rear surface of the substrate 100 in a second direction opposite to the first direction, the second doped conductive layer 150 includes a second doping element of a different type from that of the first doping element in the first doped conductive layer 120, and a full width at half maximum near a first peak of a Raman spectrum for the first doped conductive layer 120 is not greater than a full width at half maximum near a first peak of a Raman spectrum for the second doped conductive layer 150.

It can be understood that the front surface of the substrate 100 receives more incident light than the rear surface of the substrate 100. Thus, for the embodiments of the present disclosure in which the first doped conductive layer 120 is formed on the front surface of the substrate 100 and the front surface of the substrate 100 receives more incident light, it is configured that a full width at half maximum corresponding to the first doped conductive layer 120 is not greater than a full width at half maximum corresponding to the second doped conductive layer 150, such that a crystallite size of the first doped conductive layer 120 is not less than a crystallite size of the second doped conductive layer 150. In this way, a parasitic absorption of incident light on the front surface of the substrate 100 by the first doped conductive layer 120 can be low, thereby improving utilization rate of incident light by the substrate 100. In addition, the first doped conductive layer 120 is formed only to be aligned with the metal pattern region and over the front surface of the substrate 100. In this way, parasitic absorption of incident light on the non-metal pattern region by the first doped conductive layer 120 can be greatly reduced, thereby greatly improving utilization rate of the incident light. Herein, the metal pattern region refers to a region on the front surface of the substrate 100 and below a corresponding electrode of the solar cell, and the non-metal pattern region refers to an area on the front surface of the substrate 100 excluding the metal pattern region.

Moreover, as the crystallite size of the first doped conductive layer 120 increases, the passivation effect of the first doped conductive layer 120 will be significantly enhanced.

This is because, the larger the crystallite size of the first doped conductive layer 120, the less the number of grain boundaries in the first doped conductive layer 120, and the less the number of grain boundaries, the less the recombination of carriers at the grain boundaries in the first doped conductive layer 120. In this way, recombination of carriers can be reduced, and concentration of the carrier can be increased. Since the first doped conductive layer 120 is formed only to be aligned with the metal pattern region and over the front surface of the substrate 100, a band bending is formed by the first doped conductive layer 120 in the metal pattern region on the front surface of the substrate 100, such that carriers are collected in the metal pattern region on the front surface of the substrate 100. This weakens the passivation performance of the front surface of the substrate 100, to a certain degree, compared to the rear surface of the substrate 100. Thus, for the purpose of improving the recombination of carriers in the metal pattern region on the front surface of the substrate 100, it is necessary to improve the passivation performance of the first doped conductive layer 120, so that recombination of relatively many carriers on the front surface of the substrate 100 can be prevented, thereby preventing the passivation performance of the front surface of the substrate 100 from being greatly reduced. In this way, the short-circuit current and the open-circuit voltage can be increased while maintaining a high utilization rate of incident light by the front surface of the substrate 100, thereby improving the photoelectric conversion performance of the solar cell.

In some embodiments, a full width at half maximum near the first peak of the Raman spectrum for the first doped conductive layer 120 is equal to a full width at half maximum near the first peak of the Raman spectrum for the second doped conductive layer 150, such that the crystallite size of the first doped conductive layer 120 is identical to the crystallite size of the second doped conductive layer 150. In other words, crystal grains of the second doped conductive layer 150 also have a relatively small size, such that a relatively good passivation performance of the second doped conductive layer 150 can be maintained. Since the second doped conductive layer 150 and the substrate 100 form a PN junction, that is, the second doped conductive layer 150 is used to generate photo-generated carriers, maintenance of the good passivation performance of the second doped conductive layer 150 is conducive to reducing the recombination of the photo-generated carriers on the rear surface of the substrate 100. In this way, migration rate of photo-generated carriers can be improved, thereby increasing the carrier concentration in the substrate 100.

In some embodiments, a full width at half maximum near the first peak of the Raman spectrum for the first doped conductive layer 120 is smaller than a full width at half maximum near the first peak of the Raman spectrum for the second doped conductive layer 150, that is to say, the crystallite size of the first doped conductive layer 120 is larger than the crystallite size of the second doped conductive layer 150. In this way, compared with the second doped conductive layer 150, the first doped conductive layer 120 has a weaker parasitic absorption capability for incident light, such that the parasitic absorption of the incident light by the first doped conductive layer 120 can be reduced. Since the incident light received by the front surface of the substrate 100 is more than that received by the rear surface of the substrate 100, configuration of the parasitic absorption of the incident light by the first doped conductive layer 120 is of great significance for increasing the overall utilization rate of incident light by the solar cell.

The substrate 100 is used to receive incident light and generate photo-generated carriers. In some embodiments, the substrate 100 may be a silicon substrate, and the materials of the silicon substrate may include at least one of monocrystalline silicon, polycrystalline silicon, amorphous silicon, or microcrystalline silicon. In some other embodiments, the materials of the substrate 100 may also include silicon carbide, an organic material or a multicomponent compound. The multicomponent compound may include, but is not limited to, perovskite, gallium arsenide, cadmium telluride, copper indium selenide and the like.

In some embodiments, the substrate 100 includes an N-type or P-type doping element. The N-type element may be selected from group V elements, such as phosphorus (P) element, bismuth (Bi) element, antimony (Sb) element or arsenic (As) element and the like. The P-type element may be selected from group III elements, such as boron (B) element, aluminum (Al) element, gallium (Ga) element or indium (In) element. For example, when the substrate 100 is a P-type substrate, it includes a P-type doping element. Or, when the substrate 100 is an N-type substrate, it includes an N-type doping element.

Both the front surface and the rear surface of the substrate 100 can be used to receive incident light or reflected light. In some embodiments, the front surface of the substrate 100 may be configured to be a pyramid textured surface, so that the front surface of the substrate 100 has a low reflectivity to incident light, so that has a high absorption and utilization rate of incident light. The rear surface of the substrate 100 may be configured to be a non-pyramid textured surface, for example in a form of stacked steps, so that the second tunnel layer 140 formed on the rear surface of the substrate 100 has high density and uniformity. In this way, the second tunnel layer 140 can have a good passivation effect on the rear surface of the substrate 100.

The first tunnel layer 110 and the first doped conductive layer 120 formed over the front surface of the substrate 100 are used to form a passivation contact structure for the front surface of the substrate 100, and the second tunnel layer 140 and the second doped conductive layer 150 formed over the rear surface of the substrate 100 are used to form a passivation contact structure for the rear surface of the substrate 100. The solar cell forms a double-sided TOPCON (Tunnel Oxide Passivated Contact) cell by forming passivation contact structures for the front surface and rear surface of the substrate 100. In this way, the passivation contact structures formed on the front surface and the rear surface of the substrate 100 can reduce recombination of carrier on the front surface and the rear surface of the substrate 100. This greatly reduces loss of the carrier of the solar cell compared with forming the passivation contact structure on only one of the surfaces of the substrate 100, thereby increasing the open-circuit voltage and short-circuit current of the solar cell. In the embodiments of the present application, the first tunnel layer 110 and the first doped conductive layer 120 are formed only to be aligned with the metal pattern region on the front surface of the substrate 100. In this way, the parasitic absorption of incident light by the first doped conductive layer 120 can be reduced, and the absorption and utilization rate of incident light by the non-metal pattern region can be improved.

By forming the passivation contact structures, the recombination of carriers on the surfaces of the substrate 100 can be reduced, thereby increasing the open-circuit voltage of the solar cell and improving the photoelectric conversion efficiency of the solar cell. In some embodiments, the materials of the first tunnel layer 110 and the second tunnel layer 140 may be dielectric materials, such as any one of silicon oxide, magnesium fluoride, amorphous silicon, polysilicon, silicon carbide, silicon nitride, silicon oxynitride, aluminum oxide and titanium oxide.

The first doped conductive layer 120 and the second doped conductive layer 150 are used for field passivation. They form built-in electric fields at the interfaces with the substrate 100 to reduce the concentration of electrons or holes at the interfaces with the substrate 100, thereby achieving the effect of surface passivation.

In some embodiments, the testing principle of the Raman spectra for the first doped conductive layer 120 and the second doped conductive layer 150 is as follows: monochromatic laser emitted by a laser passes through a bandpass filter and a beam splitter, and then is converged by objective lens and irradiates on a surface of the first doped conductive layer 120 and a surface of the second doped conductive layer 150, respectively. Laser photons collide with respective atoms in the first doped conductive layer 120 and the second doped conductive layer 150 to cause scattering of the laser photons. The light beams subjected to inelastic collisions pass through a beam splitter and a reflection filter, and then are converged on a sonograph to form peaks of a respective Raman spectrum for the first doped conductive layer 120 and the second doped conductive layer 150.

It can be known based on the above analysis that, the first peak is related to the physical properties of the first doped conductive layer 120 and the second doped conductive layer 150. In practice, during the testing process of the Raman spectra for the first doped conductive layer 120 and the second doped conductive layer 150, the peak value usually fluctuates around the first peak, therefore a limitation "near the first peak" is used herein. In some embodiments, a fluctuation range of the peak value corresponding to the first peak may be from $-10$ $cm^{-1}$ to $10$ $cm^{-1}$.

A full width at half maximum in a Raman spectrum may be used to characterize the respective crystallite sizes of the first doped conductive layer 120 and the second doped conductive layer 150. The larger the full width at half maximum in the respective Raman spectrum for the first doped conductive layer 120 and the second doped conductive layer 150, the smaller the respective crystallite sizes of the first doped conductive layer 120 and the second doped conductive layer 150. The smaller the full width at half maximum in the respective Raman spectrum for the first doped conductive layer 120 and the second doped conductive layer 150, the larger the respective crystallite sizes of the first doped conductive layer 120 and the second doped conductive layer 150.

In some embodiments, materials of the first doped conductive layer 120 and the second doped conductive layer 150 include at least one of silicon carbide, microcrystalline silicon or polycrystalline silicon. Silicon carbide, microcrystalline silicon and polycrystalline silicon have the advantages of simple production and low production cost, thereby being conducive to greatly improving the production efficiency and yield of solar cells.

It should be understood that the first peak is associated with the respective material of the first doped conductive layer 120 and the second doped conductive layer 150. When the materials of the first doped conductive layer 120 and the second doped conductive layer 150 are silicon carbide, microcrystalline silicon or polycrystalline silicon, the respective first peak may have different peak values.

Figure 2:
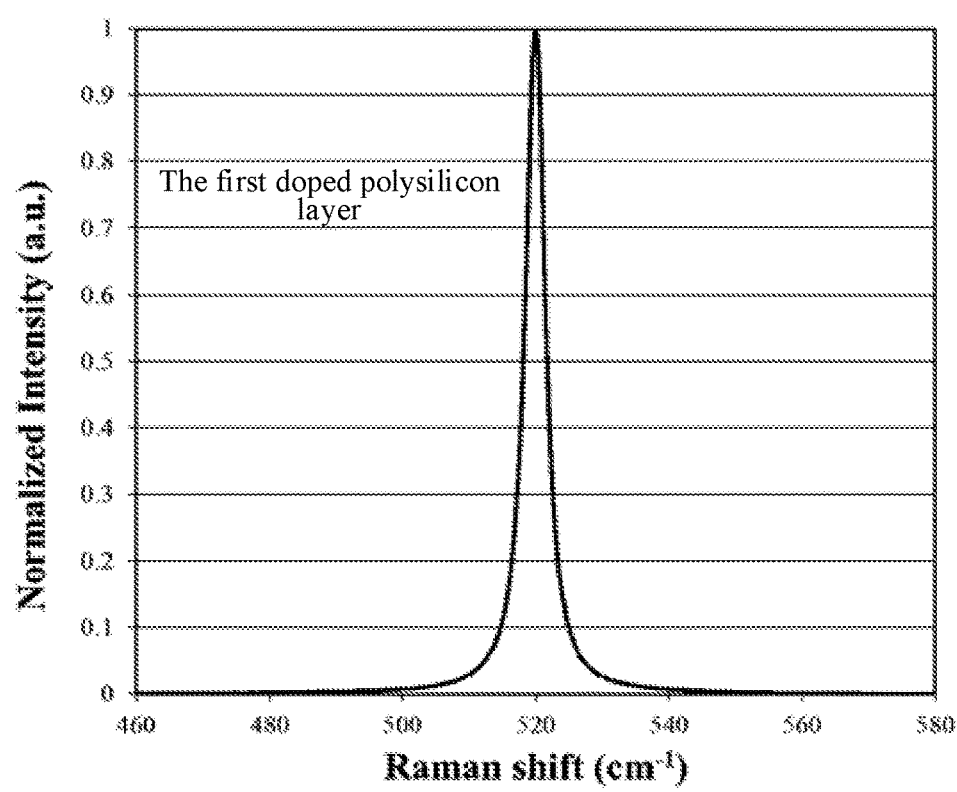
FIG. 2 is a schematic diagram of a Raman spectrum for the first doped conductive layer.

Referring to FIG. 2, in some embodiments, when the first doped conductive layer 120 and the second doped conductive layer 150 are made of a same material of polysilicon, the first peak for the first doped conductive layer may be at 520 $cm^{-1}$, and the full width at half maximum near 520 $cm^{-1}$ corresponding to the first doped conductive layer 120 may range from 2 $cm^{-1}$ to 6 $cm^{-1}$, for example, 2 $cm^{-1}$ to 2.5 $cm^{-1}$, 2.5 $cm^{-1}$ to 3 $cm^{-1}$, 3 $cm^{-1}$ to 3.3 $cm^{-1}$, 3.3 $cm^{-1}$ to 3.4 $cm^{-1}$, 3.4 $cm^{-1}$ to 3.5 $cm^{-1}$, 3.5 $cm^{-1}$ to 3.7 $cm^{-1}$, 3.7 $cm^{-1}$ to 4 $cm^{-1}$, 4 $cm^{-1}$ to 4.5 $cm^{-1}$, 4.5 $cm^{-1}$ to 5 $cm^{-1}$, 5 $cm^{-1}$ to 5.5 $cm^{-1}$ or 5.5 $cm^{-1}$ to 6 $cm^{-1}$. Within this range, the full width at half maximum corresponding the first doped conductive layer 120 is relatively small, and within this range, the crystallite size of the first doped conductive layer 120 is relatively large, so that the first doped conductive layer 120 has a weak parasitic absorption capability for incident light, thereby improving the absorption and utilization rate of incident light. And within this range, the first doped conductive layer 120 has a good passivation performance. In this way, not only the parasitic absorption of the incident light on the front surface of the substrate 100 by the first doped conductive layer 120 can be reduced, but also the passivation performance of the first doped conductive layer 120 on the front surface of the substrate 100 can be improved, so that the first doped conductive layer 120 forms a strong electrostatic field in the metal pattern region on the front surface of the substrate 100, thereby increasing the migration rate of carriers on the front surface of the substrate 100 and significantly enhancing the field passivation effect of the first doped conductive layer 120.

Figure 3:
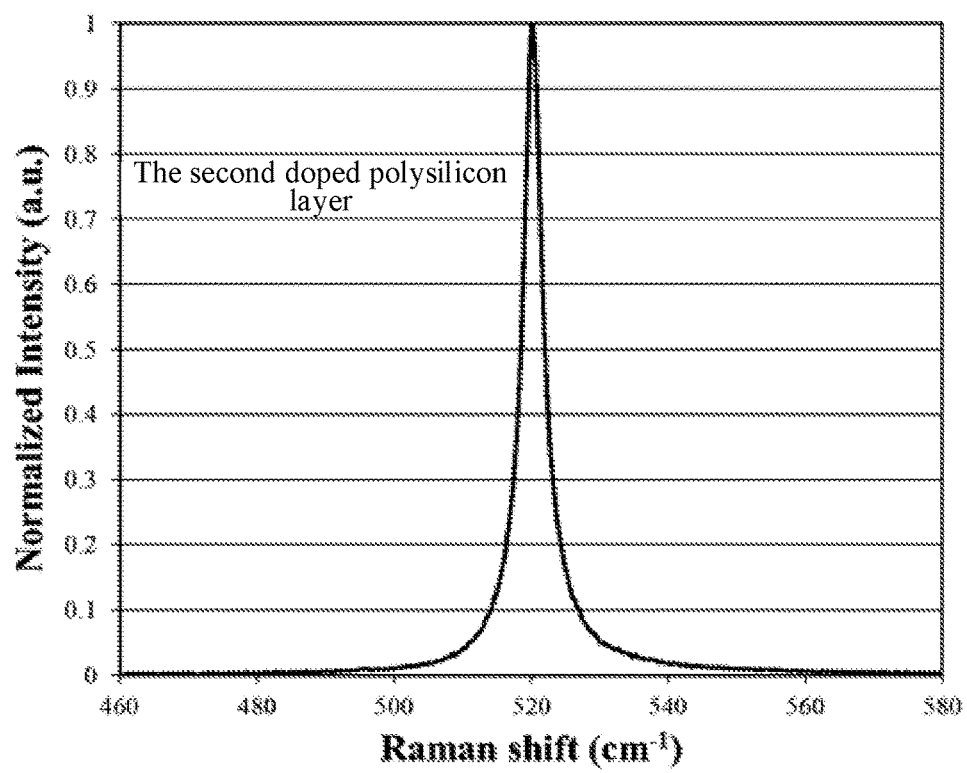
FIG. 3 is a schematic diagram of a Raman spectrum for the second doped conductive layer.

Referring to FIG. 3, in some embodiments, the first peak for the second doped conductive layer is at 520 $cm^{-1}$, and the full width at half maximum near 520 $cm^{-1}$ corresponding to the second doped conductive layer 150 ranges from 2 $cm^{-1}$ to 8 $cm^{-1}$, for example, 2 $cm^{-1}$ to 2.5 $cm^{-1}$, 2.5 $cm^{-1}$ to 3 $cm^{-1}$, 3 $cm^{-1}$ to 3.3 $cm^{-1}$, 3.3 $cm^{-1}$ to 3.5 $cm^{-1}$, 3.5 $cm^{-1}$ to 3.7 $cm^{-1}$, 3.7 $cm^{-1}$ to 3.9 $cm^{-1}$, 3.9 $cm^{-1}$ to 4.5 $cm^{-1}$, 4.5 $cm^{-1}$ to 5 $cm^{-1}$, 5 $cm^{-1}$ to 5.5 $cm^{-1}$, 5.5 $cm^{-1}$ to 6 $cm^{-1}$, 6 $cm^{-1}$ to 6.5 $cm^{-1}$, 6.5 $cm^{-1}$ to 7 $cm^{-1}$, 7 $cm^{-1}$ to 7.5 $cm^{-1}$, or 7.5 $cm^{-1}$ to 8 $cm^{-1}$. Within this range, the full width at half maximum corresponding the second doped conductive layer 150 is larger than the full width at half maximum corresponding the first doped conductive layer 120, such that the crystallite size of the first doped conductive layer 120 is larger than the crystallite size of the second doped conductive layer 150, thereby leading to a weaker parasitic absorption capability of the first doped conductive layer 120 for incident light, which is conducive to improving the overall absorption and utilization rate of incident light of the solar cell. Moreover, it can be found that within this range, the difference between the full width at half maximum corresponding the second doped conductive layer 150 and the full width at half maximum corresponding the first doped conductive layer 120 is not too great. In other words, the difference between the crystallite size of the second doped conductive layer 150 and the crystallite size of the first doped conductive layer 120 is not too great. In this way, less parasitic absorption of incident light by the first doped conductive layer 120 can be ensured, while a smaller number of grain boundaries formed in the second doped conductive layer 150 also can be ensured, so that less recombination of carriers occurs in the second doped conductive layer 150. In this way, concentration of carriers on the rear surface of the substrate 100 can be increased, and the overall open-circuit voltage and short-circuit current of the solar cell can be improved, thereby improving the photoelectric conversion performance of the solar cell.

In some embodiments, a thickness of the first doped conductive layer is configured to be not greater than a thickness of the second doped conductive layer 150. In some embodiments, the thickness of the first doped conductive layer 120 may be greater than the thickness of the second doped conductive layer 150. It should be understood that the crystallite size of the first doped conductive layer 120 is not smaller than the crystallite size of the second doped conductive layer 150. In some embodiments, the crystallite size of the first doped conductive layer 120 is configured to be greater than the crystallite size of the second doped conductive layer 150, such that during a production process of the first doped conductive layer 120, diffusion rate of the doping element in the first doped conductive layer 120 is low, leading to a low concentration of the doping element in the first doped conductive layer 120. This may cause a high sheet resistance of the first doped conductive layer 120, and therefore cause a high loss of metal contact recombination in the first doped conductive layer 120. In view of this, for the purpose of increasing the sheet resistance of the first doped conductive layer 120 while improving light absorption capability of the first doped conductive layer 120, the thickness of the first doped conductive layer 120 is configured to be less than the thickness of the second doped conductive layer 150, so that the doping element in the first doped conductive layer 120 is concentrated, which can increase the concentration of the doping element in the first doped conductive layer 120, and reduce the sheet resistance of the first doped conductive layer 120. In addition, the thickness of the first doped conductive layer 120 is configured to be relatively small, such that the parasitic absorption capability of the first doped conductive layer 120 for incident light can be further reduced.

Moreover, the thickness of the second doped conductive layer 150 is configured to be relatively large, such that the passivation effect of the second doped conductive layer 150 can be enhanced. This is because, the crystallite size of the second doped conductive layer 150 is configured to be relatively small, such that during a production process of the second doped conductive layer 150, diffusion rate of the doping element in the second doped conductive layer 150 is relatively high, leading to a high concentration of the doping element in the second doped conductive layer 150, thereby reducing the passivation performance of the second doped conductive layer 150. Since the second doped conductive layer 150 and the substrate 100 together form a PN junction, a good passivation performance of the second doped conductive layer 150 is needed, so as to reduce the recombination of photo-generated carriers and increase the concentration of carriers in the substrate 100. To this end, the thickness of the second doped conductive layer 150 is configured to be relatively large, in order to provide the doping element diffused into the second doped conductive layer 150 with a relatively long diffusion path. In this way, an excessive concentration of the doping element in the second doped conductive layer 150 due to excessively concentrated doping element in the second doped conductive layer 150 can be avoided.

In some other embodiments, the thickness of the first doped conductive layer 120 may be equal to the thickness of the second doped conductive layer 150.

In some embodiments, the thickness of the first doped conductive layer 120 ranges from 20 nm to 300 nm, such as 20 nm to 50 nm, 50 nm to 80 nm, 80 nm to 130 nm, 130 nm to 150 nm, 130 nm to 180 nm, 180 nm to 230 nm, 230 nm to 260 nm, or 260 nm to 300 nm. Within this range, the thickness of the first doped conductive layer 120 is relatively small, such that the doping element in the first doped conductive layer 120 is relatively concentrated, leading to a relatively high concentration of the doping element in the first doped conductive layer 120 and therefore a relatively low sheet resistance of the first doped conductive layer 120, which is conducive to reducing the loss of metal contact recombination in the first doped conductive layer 120, and enhancing collection of carriers. Moreover, within this range, the thickness of the first doped conductive layer 120 is relatively small, such that the parasitic absorption of incident light by the first doped conductive layer 120 can be further reduced, thereby improving the absorption and utilization rate of incident light, enhancing the collection of carrier, and improving the open-circuit voltage and short-circuit current.

In some embodiments, the thickness of the second doped conductive layer 150 ranges from 50 nm to 500 nm, such as 50 nm to 100 nm, 100 nm to 150 nm, 150 nm to 200 nm, 200 nm to 250 nm, 250 nm to 300 nm, 350 nm to 400 nm, 400 nm to 450 nm, or 450 nm to 500 nm. Within this range, the thickness of the second doped conductive layer 150 is relatively large, such that the diffusion path for the doping element diffused into the second doped conductive layer 150 can be lengthened, thereby avoiding an excessive concentration of the doping element in the second doped conductive layer 150 due to excessively concentrated doping element in the second doped conductive layer 150. In this way, a good passivation performance of the second doped conductive layer 150 can be obtained, which is conducive to improving the migration rate of the photo-generated carriers generated by the second doped conductive layer 150 to the substrate 100.

The thickness of the first doped conductive layer 120 is configured to be within a range of 20 nm to 300 nm, and the thickness of the second doped conductive layer 150 is configured to be within a range of 50 nm to 500 nm. In this way, the parasitic absorption of incident light and the sheet resistance of the first doped conductive layer 120 can be reduced. Therefore, the collection rate of carriers in the first doped conductive layer 120 can be improved, and the migration rate of photo-generated carriers generated on the rear surface of the substrate 100 can be increased, thereby improving the overall photoelectric conversion performance of the solar cell.

In some embodiments, the first doped conductive layer includes an activated first doping element obtained by performing annealing on the first doping element to activate a part of the first doping element, and a concentration of the activated first doping element ranges from $1 \times 10^{20}$ atoms/cm$^3$ to $6 \times 10^{20}$ atoms/cm$^3$, such as $1 \times 10^{20}$ atoms/cm$^3$ to $2 \times 10^{20}$ atoms/cm$^3$, $2 \times 10^{20}$ atoms/cm$^3$ to $3 \times 10^{20}$ atoms/cm$^3$, $3 \times 10^{20}$ atoms/cm$^3$ to $4 \times 10^{20}$ atoms/cm$^3$, $4 \times 10^{20}$ atoms/cm$^3$ to $5 \times 10^{20}$ atoms/cm$^3$, or $5 \times 10^{20}$ atoms/cm$^3$ to $6 \times 10^{20}$ atoms/cm$^3$. It should be understood that in the first doped conductive layer 120 and the second doped conductive layer 150, only an activated doping element can be used as a donor impurity to implement field passivation effects of the first doped conductive layer 120 and the second doped conductive layer 150. Within this range, the concentration of the activated first doping element in the first doped conductive layer 120 is relatively high. On the one hand, the first doped conductive layer forms a strong electrostatic field on the front surface of the substrate 100, which is conducive to enhancing the field passivation effect of the first doped conductive layer 120. On the other hand, within this range, the sheet resistance of the first doped conductive layer 120 is relatively low, which is conducive to reducing the loss of metal contact recombination in the first doped conductive layer, so that the collection efficiency of carriers can be improved.

In some embodiments, the second doped conductive layer includes an activated second doping element obtained by performing annealing on the second doping element to activate a part of the second doping element, and a concentration of the activated second doping element ranges from $4\times10^{19}$ atoms/cm$^3$ to $9\times10^{19}$ atoms/cm$^3$, such as $4\times10^{19}$ atoms/cm$^3$ to $5\times10^{19}$ atoms/cm$^3$, $5\times10^{19}$ atoms/cm$^3$ to $6\times10^{19}$ atoms/cm$^3$, $6\times10^{19}$ atoms/cm$^3$ to $7\times10^{19}$ atoms/cm$^3$, $7\times10^{19}$ atoms/cm$^3$ to $8\times10^{19}$ atoms/cm$^3$, or $8\times10^{19}$ atoms/cm$^3$ to $9\times10^{19}$ atoms/cm$^3$. Within this range, the concentration of the activated second doping element in the second doped conductive layer 150 is not too high, so that Auger recombination in the second doped conductive layer can be reduced, and recombination of carriers on the rear surface of the substrate 100 can be reduced. In this way, the migration rate of the carriers which are generated by the second doped conductive layer 150 and transfer to the substrate 100 can be improved.

Moreover, when the concentration of the activated first doping element ranges from $1\times10^{20}$ atoms/cm$^3$ to $6\times10^{20}$ atoms/cm$^3$ and the concentration of the activated second doping element ranges from $4\times10^{19}$ atoms/cm$^3$ to $9\times10^{19}$ atoms/cm$^3$, the concentration of the first doping element in the first doped conductive layer 120 formed on the front surface of the substrate 100 is lower than the concentration of the second doping element in the second doped conductive layer 150 formed on the rear surface of the substrate 100. In this way, loss of metal contact recombination on the front surface of the substrate 100 can be reduced, and migration rate of the photo-generated carriers on the rear surface of the substrate 100 can be improved, thereby improving the overall photoelectric conversion performance of the solar cell.

In some embodiments, the substrate 100 is an N-type substrate, the first doped conductive layer 120 is an N-type doped conductive layer, and the second doped conductive layer 150 is a P-type doped conductive layer.

In some other embodiments, the substrate 100 may be a P-type silicon substrate, the first doped conductive layer 120 is a P-type doped conductive layer, and the second doped conductive layer 150 is an N-type doped conductive layer.

In some other embodiments, when the substrate 100 is an N-type substrate, the first doped conductive layer 120 is an N-type doped conductive layer, and the second doped conductive layer 150 is a P-type doped conductive layer, the doping element in the first doped conductive layer may include phosphorus element, and the doping element in the second doped conductive layer 150 may include boron element.

In some embodiments, the solar cell further includes a first passivation layer 170, a first portion of the first passivation layer 170 is formed on a surface of the first doped conductive layer 120 facing away from the substrate 100, and a second portion of the first passivation layer 170 is formed on the front surface and is aligned with a non-metal pattern region on the front surface.

The first passivation layer 170 can provide a good passivation effect on the front surface of the substrate 100, for example, it can implement a good chemical passivation on the dangling bonds on the front surface of the substrate 100, reduce the density of defect states on the front surface of the substrate 100, and inhibit recombination of the carriers on the front surface of the substrate 100. The second portion of the first passivation layer 170 is in direct contact with the front surface of the substrate 100, thus there is no first tunnel layer 110 and first doped conductive layer 120 between the first portion of the first passivation layer 170 and the substrate 100. In this way, parasitic absorption of incident light by the first doped conductive layer 120 can be reduced.

In some embodiments, a top surface of the first portion of the first passivation layer 170 is not flush with a top surface of the second portion of the first passivation layer 170. For example, a top surface of the first portion of the first passivation layer 170 may be higher than a top surface of the second portion of the first passivation layer 170, so that an excessive thickness of the second portion formed on the front surface of the substrate 100 can be avoided. In this way, the stress damage on the front surface of the substrate 100 due to the relatively large thickness of the second portion can be prevented, thereby preventing relatively many interface state defects from occurring on the front surface of the substrate 100, and therefore preventing relatively many recombination centers of carriers from occurring.

In some embodiments, the first passivation layer 170 may have a single-layer structure. In some other embodiments, the first passivation layer 170 may have a multi-layer structure. In some embodiments, the material of the first passivation layer 170 may include at least one of silicon oxide, aluminum oxide, silicon nitride, or silicon oxynitride.

In some embodiments, the solar cell further includes a first electrode 160 formed over the metal pattern region and being electrically connected with the first doped conductive layer 120.

The PN junction formed on the rear surface of the substrate 100 is used to receive incident light and generate photo-generated carriers. The generated photo-generated carriers are transported from the substrate 100 to the first doped conductive layer 120, and then to the first electrode 160. The first electrode 160 is used to collect photo-generated carriers. Since the doping ions in the first doped conductive layer 120 are of the same type as that of the doping ions in the substrate 100, the loss of metal contact recombination between the first electrode 160 and the first doped conductive layer 120 can be reduced, and the contact recombination of carriers between the first electrode 160 and the first doped conductive layer 120 can be reduced. In this way, the short-circuit current and the photoelectric conversion performance of the solar cell can be improved. In some embodiments, the first electrode 160 is formed over the front surface of the substrate 100 and is aligned with the metal pattern region. The first electrode 160 penetrates the first passivation layer 170 and is in electrical contact with the first doped conductive layer 120.

Figure 4:
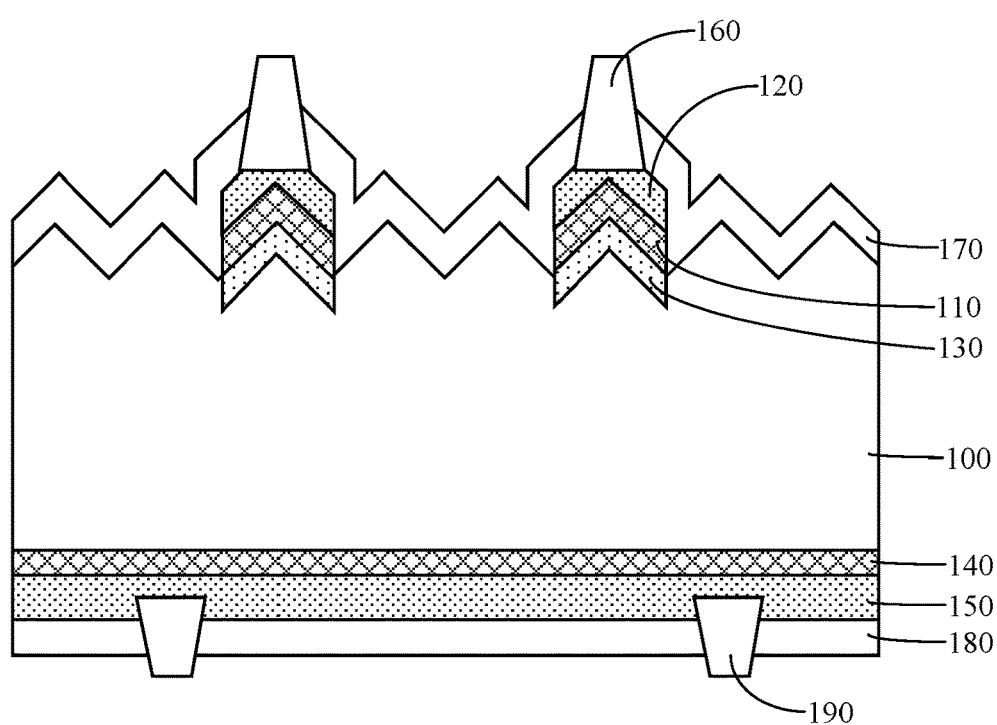
FIG. 4 is a structural schematic diagram of a section of another solar cell according to some embodiments of the present disclosure.

Referring to FIG. 4, in some embodiments, the solar cell further includes a diffusion region 130 formed in the substrate 100 and being aligned with the metal pattern region. A top of the diffusion region 130 is in contact with the first tunnel layer 110, and a concentration of a doping element in the diffusion region 130 is greater than a concentration of the doping element in the substrate 100.

The diffusion region 130 may be used as a transport channel for carrier, and the diffusion region 130 is formed only in a region in the substrate 100 which is aligned with the metal pattern region, such that the carriers in the substrate 100 can be easily transported into a doped conductive layer through the diffusion region 130, that is to say, the diffusion region 130 functions as a transport channel for carrier. In addition, since the diffusion region 130 is formed only in a region in the substrate 100 which is aligned with the metal pattern region, the carriers in the substrate 100 can be concentrated and transported to the diffusion region 130, and then to the first doped conductive layer 120 through the diffusion region 130. In this way, concentration of the carriers in the first doped conductive layer 120 can be greatly increased. It is noted that in embodiments of the present disclosure, the diffusion region 130 is not formed in a region in the substrate 100 which is aligned with the non-metal pattern region, such that an excessive concentration of the carriers in the non-metal pattern region on the front surface of the substrate 100 can be avoided, thereby preventing severe recombination of carriers from occurring in the non-metal pattern region on the front surface of the substrate 100. Moreover, the carriers in the substrate 100 can be prevented from being transported to the non-metal pattern region on the front surface of the substrate 100, thereby preventing carriers from accumulating in the non-metal pattern region on the front surface of the substrate 100, which may cause an "inactive layer" in the non-metal pattern region on the front surface of the substrate 100 and therefore cause excessive recombination of carriers. In this way, the overall photoelectric conversion performance of the solar cell can be improved.

In some embodiments, the solar cell further includes a second passivation layer 180 formed on a surface of the second doped conductive layer 150 facing away from the substrate 100. The second passivation layer 180 is used to provide a good passivation effect to the rear surface of the substrate 100, reduce the density of defect states on the rear surface of the substrate 100, and inhibit recombination of the carriers on the rear surface of the substrate 100. Since the unevenness of the platform-formed protruding structure formed on the rear surface of the substrate 100 is relatively small, the second passivation layer 180 obtained by depositing on the rear surface of the substrate 100 has a relatively high flatness, so that the passivation performance of the second passivation layer 180 can be improved.

In some embodiments, the second passivation layer 180 may have a single-layer structure. In some other embodiments, the second passivation layer 180 may have a multi-layer structure. In some embodiments, the material of the second passivation layer 180 may include at least one of silicon oxide, aluminum oxide, silicon nitride, or silicon oxynitride.

In some embodiments, the solar cell further includes a second electrode 190 formed on the rear surface of the substrate 100 and being electrically connected with the second doped conductive layer 150. The second electrode 190 penetrates the second passivation layer 180 and is in electrical contact with the second doped conductive layer 150.

In the solar cell as illustrated in the above embodiments, a full width at half maximum corresponding to the first doped conductive layer 120 formed on the front surface is not greater than a full width at half maximum corresponding to the second doped conductive layer 150, such that a crystallite size of the first doped conductive layer 120 is not less than a crystallite size of the second doped conductive layer 150. The larger the crystallite size of the first doped conductive layer 120, the weaker the absorption ability of incident light of the first doped conductive layer 120. Therefore, a relatively less crystallite size of the first doped conductive layer 120 can lead to a relatively less parasitic absorption of incident light on the front surface by the first doped conductive layer 120, thereby improving absorption and utilization rate of incident light by the doped substrate 100. In this way, the photoelectric conversion performance of the solar cell can be improved.

COMPARATIVE EXAMPLE

The comparative example provides a solar cell with a same structure as that of the solar cell as illustrated in the embodiments of the present disclosure, the difference between these two solar cells lies in that in a respective Raman spectrum for the solar cell according to the embodiments of the present disclosure and the solar cell according to the comparative example, a full width at half maximum corresponding to the first doped conductive layer 120 of the solar cell according to the embodiments of the present disclosure is less than a full width at half maximum corresponding to a doped conductive layer formed on a front surface of the substrate 100 of the solar cell according to the comparative example. For example, the full width at half maximum corresponding to the first doped conductive layer 120 of the solar cell according to the embodiments of the present disclosure is 3.7 cm$^{-1}$, and the full width at half maximum corresponding to the doped conductive layer formed on the front surface of the substrate 100 of the solar cell according to the comparative example is 10.1 cm$^{-1}$. With comparative experiments, the obtained parameters according to the embodiments of the present disclosure and those according to the comparative example are compared as shown in Table 1:

TABLE 1

|  | Open-circuit voltage Uoc/mV | Conversion efficiency Eff/% |
|---|---|---|
| Embodiments of the present disclosure | 726.4 | 25.32 |
| Comparative example | 705.6 | 24.63 |

It can be seen from Table 1 that, compared with the comparative example, both of the open-circuit voltage and the conversion efficiency of the solar cell according to embodiments of the present disclosure are higher. It is because that, in the embodiments of the present disclosure, the full width at half maximum corresponding to the first doped conductive layer 120 formed on the front surface of the substrate 100 is relatively small, such that the parasitic absorption of incident light by the first doped conductive layer 120 is reduced, while maintaining the good passivation performance of the first doped conductive layer 120. In this way, the overall photoelectric conversion performance of the solar cell can be improved. It can be seen that a relatively small full width at half maximum corresponding to a doped conductive layer formed on the front surface of the substrate 100 can efficiently improve the photoelectric conversion performance of the solar cell.

Figure 5:
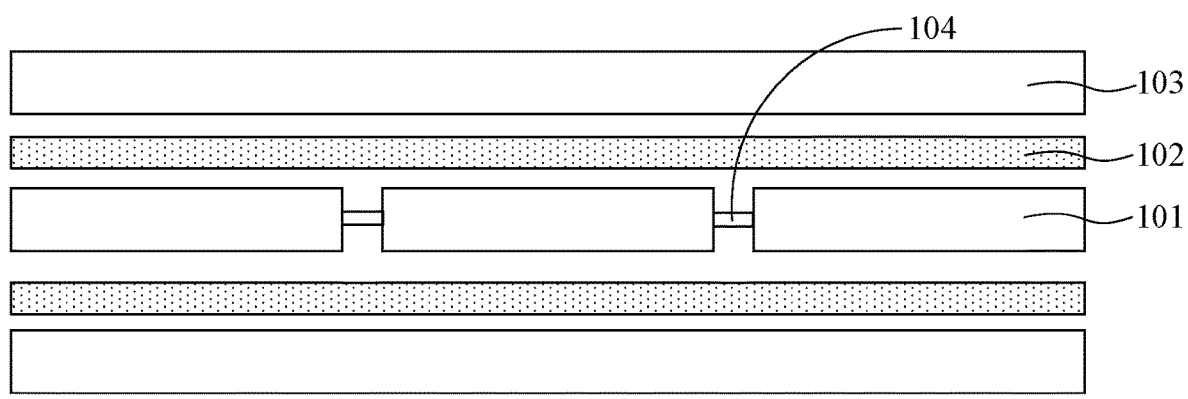
FIG. 5 is a structural schematic diagram of a photovoltaic module according to some embodiments of the present disclosure.

Embodiments of the present disclosure further provide a photovoltaic module, referring to FIG. 5, the photovoltaic module includes: at least one cell string formed by connecting a plurality of solar cells 101 as illustrated in the embodiments; at least one encapsulation layer 102 configured to cover a surface of the at least one cell string; and at least one cover plate 103 configured to cover a surface of the at least one encapsulation layer 102 facing away from the at least one cell string. The solar cells 101 are electrically connected to each other in a form of a whole piece or multiple pieces to form a plurality of cell strings, and the plurality of cell strings are electrically connected to each other in series and/or parallel manner.

In some embodiments, the plurality of cell strings may be electrically connected to each other through conductive strips 104. The encapsulation layers 102 cover a front surface and a rear surface of the solar cell 101. For example, the encapsulation layer 102 may be an organic encapsulation adhesive film, such as an adhesive film of ethylene-vinyl acetate copolymer (EVA), an adhesive film of polyethylene octene co-elastomer (POE), an adhesive film of polyethylene terephthalate (PET), or the like. In some embodiments, the cover plate 103 may be a cover plate 103 with a light-transmitting function, such as a glass cover plate, a plastic cover plate, or the like. For example, the surface of the cover plate 103 facing towards the encapsulation layer 102 may be an uneven surface, thereby increasing the utilization rate of incident light.

Although the present disclosure is disclosed above with exemplary embodiments, they are not used to limit the claims. Any person skilled in the art can make some possible changes and modifications without departing from the concept of the present disclosure. The scope of protection of the present disclosure shall be subject to the scope defined by the claims.

Those having ordinary skill in the art shall understand that the above embodiments are exemplary implementations for realizing the present disclosure. In practice, any person skilled in the art to which the embodiments of the present disclosure belong may make any modifications and changes in forms and details without departing from the scope of the present disclosure. Therefore, the patent protection scope of the present disclosure shall still be subject to the scope limited by the appended claims.

What is claimed is:

1. A solar cell, comprising:
a substrate having a front surface and a rear surface opposite to each other;
a first tunnel layer formed directly on the front surface of the substrate and a first doped conductive layer formed over a side of the first tunnel layer facing away from the substrate, wherein the first tunnel layer and the first doped conductive layer are each aligned with a metal pattern region on the front surface, and the first doped conductive layer comprises a first doping element of a same type as that of a doping element in the substrate; and
a second tunnel layer formed on the rear surface of the substrate and a second doped conductive layer formed over a side of the second tunnel layer facing away from the substrate, wherein the second doped conductive layer comprises a second doping element of a different type from that of the first doping element in the first doped conductive layer, and wherein a full width at half maximum near a first peak of a Raman spectrum for the first doped conductive layer is not greater than a full width at half maximum near a first peak of a Raman spectrum for the second doped conductive layer, and a crystallite size of the first doped conductive layer is not less than a crystallite size of the second doped conductive layer.

2. The solar cell according to claim 1, wherein the first peak for the first doped conductive layer is at 520 cm$^{-1}$, and full width at half maximum near 520 cm$^{-1}$ corresponding to the first doped conductive layer ranges from 2 cm$^{-1}$ to 6 cm$^{-1}$.

3. The solar cell according to claim 1, wherein the first peak for the second doped conductive layer is at 520 cm$^{-1}$, and full width at half maximum near 520 cm$^{-1}$ corresponding to the second doped conductive layer ranges from 2 cm$^{-1}$ to 8 cm$^{-1}$.

4. The solar cell according to claim 2, wherein full width at half maximum near 520 cm$^{-1}$ corresponding to the second doped conductive layer ranges from 2 cm$^{-1}$ to 8 cm$^{-1}$.

5. The solar cell according to claim 4, wherein a thickness of the first doped conductive layer is not greater than a thickness of the second doped conductive layer.

6. The solar cell according to claim 5, wherein the thickness of the first doped conductive layer ranges from 20 nm to 300 nm, and the thickness of the second doped conductive layer ranges from 50 nm to 500 nm.

7. The solar cell according to claim 6, wherein the first doped conductive layer comprises an activated first doping element obtained by performing annealing on the first doping element to activate a part of the first doping element, and a concentration of the activated first doping element ranges from $1\times10^{20}$ atoms/cm$^3$ to $6\times10^{20}$ atoms/cm$^3$.

8. The solar cell according to claim 6, wherein the second doped conductive layer comprises an activated second doping element obtained by performing annealing on the second doping element to activate a part of the second doping element, and a concentration of the activated second doping element ranges from $4\times10^{19}$ atoms/cm$^3$ to $9\times10^{19}$ atoms/cm$^3$.

9. The solar cell according to claim 1, wherein the crystallite size of the first doped conductive layer is greater than the crystallite size of the second doped conductive layer.

10. The solar cell according to claim 1, wherein the substrate is an N-type substrate, the first doped conductive layer is an N-type doped conductive layer, and the second doped conductive layer is a P-type doped conductive layer.

11. The solar cell according to claim 9, wherein the first doping element comprises phosphorus element, the second doping element comprises boron element, and materials of the first doped conductive layer and of the second doped conductive layer comprise at least one of silicon carbide, microcrystalline silicon or polycrystalline silicon.

12. The solar cell according to claim 1, further comprising a first passivation layer, wherein a first portion of the first passivation layer is formed on a surface of the first doped conductive layer facing away from the substrate, and a second portion of the first passivation layer is formed on the front surface and is aligned with a non-metal pattern region on the front surface.

13. The solar cell according to claim 12, wherein a top surface of the first portion of the first passivation layer is not flush with a top surface of the second portion of the first passivation layer.

14. The solar cell according to claim 12, wherein a material of the first passivation layer comprises at least one of silicon oxide, aluminum oxide, silicon nitride or silicon oxynitride.

15. The solar cell according to claim 1, further comprising a first electrode formed over the metal pattern region and being electrically connected with the first doped conductive layer.

16. The solar cell according to claim 1, further comprising a diffusion region formed in the substrate and being aligned with the metal pattern region, a top of the diffusion region is in contact with the first tunnel layer, and a concentration of a doping element in the diffusion region is greater than a concentration of the doping element in the substrate.

17. The solar cell according to claim 1, further comprising a second passivation layer formed on a surface of the second doped conductive layer facing away from the substrate.

18. The solar cell according to claim 12, further comprising a second passivation layer formed on a surface of the second doped conductive layer facing away from the substrate.

19. The solar cell according to claim 1, further comprising a second electrode formed on the rear surface of the substrate and being electrically connected with the second doped conductive layer.

20. A photovoltaic module, comprising:
- at least one cell string including a plurality of solar cells, wherein the plurality of solar cells are electrically connected in sequence;
- at least one encapsulation layer configured to cover a surface of the at least one cell string; and
- at least one cover plate configured to cover a surface of the at least one encapsulation layer facing away from the at least one cell string;
- wherein each of the plurality of solar cells comprises:
- a substrate having a front surface and a rear surface opposite to each other;
- a first tunnel layer formed directly on the front surface of the substrate and a first doped conductive layer formed over a side of the first tunnel layer facing away from the substrate, wherein the first tunnel layer and the first doped conductive layer are each aligned with a metal pattern region on the front surface, and the first doped conductive layer comprises a first doping element of a same type as that of a doping element in the substrate; and
- a second tunnel layer formed on the rear surface of the substrate and a second doped conductive layer formed over a side of the second tunnel layer facing away from the substrate, wherein the second doped conductive layer comprises a second doping element of a different type from that of the first doping element in the first doped conductive layer, and wherein a full width at half maximum near a first peak of a Raman spectrum for the first doped conductive layer is not greater than a full width at half maximum near a first peak of a Raman spectrum for the second doped conductive layer, and a crystallite size of the first doped conductive layer is not less than a crystallite size of the second doped conductive layer.

* * * * *